US012562094B2

(12) United States Patent
Jiang et al.

(10) Patent No.: US 12,562,094 B2
(45) Date of Patent: Feb. 24, 2026

(54) GATE DRIVE CIRCUIT AND METHOD FOR DRIVING SAME, AND DISPLAY DEVICE

(71) Applicants: Yunnan Invensight Optoelectronics Technology Co., Ltd., Yunnan (CN); BOE Technology Group Co., Ltd., Beijing (CN)

(72) Inventors: Shanghong Jiang, Beijing (CN); Dachao Li, Beijing (CN); Longfei Fan, Beijing (CN); Yaoxi Ma, Beijing (CN); Pengcheng Lu, Beijing (CN); Shengji Yang, Beijing (CN); Xiaochuan Chen, Beijing (CN)

(73) Assignees: Yunnan Invensight Optoelectronics Technology Co., Ltd., Yunnan (CN); BOE Technology Group Co., Ltd., Beijing (CN)

( * ) Notice: Subject to any disclaimer, the term of this patent is extended or adjusted under 35 U.S.C. 154(b) by 11 days.

(21) Appl. No.: 18/701,296

(22) PCT Filed: Jul. 31, 2023

(86) PCT No.: PCT/CN2023/110251
§ 371 (c)(1),
(2) Date: Nov. 7, 2024

(87) PCT Pub. No.: WO2024/045983
PCT Pub. Date: Mar. 7, 2024

(65) Prior Publication Data
US 2025/0078718 A1 Mar. 6, 2025

(30) Foreign Application Priority Data
Aug. 31, 2022 (CN) ........................ 202211053168.X

(51) Int. Cl.
*G09G 3/20* (2006.01)
*G11C 19/28* (2006.01)

(52) U.S. Cl.
CPC ... *G09G 3/2092* (2013.01); *G09G 2300/0852* (2013.01); *G09G 2310/0267* (2013.01);
(Continued)

(58) Field of Classification Search
CPC ......... G09G 3/2092; G09G 2300/0852; G09G 2310/0267; G09G 2310/0286;
(Continued)

(56) References Cited

U.S. PATENT DOCUMENTS

| | | | | |
|---|---|---|---|---|
| 5,973,533 A | * | 10/1999 | Nagaoka | .......... H03K 19/00384 |
| | | | | 327/263 |
| 2001/0045930 A1 | * | 11/2001 | Miyajima | ............ G09G 3/3677 |
| | | | | 345/92 |

(Continued)

FOREIGN PATENT DOCUMENTS

| | | |
|---|---|---|
| CN | 204029332 U | 12/2014 |
| CN | 104795106 A | 7/2015 |

(Continued)

OTHER PUBLICATIONS

CN202211053168.X first office action dated Jun. 17, 2024.
CN202211053168.X Notification to grant patent right for invention dated Jul. 31, 2024.

*Primary Examiner* — Jose R Soto Lopez
(74) *Attorney, Agent, or Firm* — IPro, PLLC

(57) ABSTRACT

Provided is a gate drive circuit, including a plurality of shift registers and buffers in cascade, wherein each of the shift registers is configured to output a first gate scanning signal stage by stage according to a preset scanning timing; and each of the buffers is configured to perform waveform inversion on the first gate scanning signal for a plurality of times to convert the first gate scanning signal into a second (Continued)

gate scanning signal, wherein falling edge time of the second gate scanning signal is less than falling edge time of the first gate scanning signal.

12 Claims, 5 Drawing Sheets

(52) U.S. Cl.
CPC . *G09G 2310/0286* (2013.01); *G09G 2310/06* (2013.01); *G09G 2310/08* (2013.01); *G11C 19/287* (2013.01)

(58) Field of Classification Search
CPC .. G09G 2310/06; G09G 2310/08; G09G 3/20; G09G 3/3677; G11C 19/287; G11C 19/28
See application file for complete search history.

(56) References Cited

U.S. PATENT DOCUMENTS

| | | | | | |
|---|---|---|---|---|---|
| 2005/0264513 | A1* | 12/2005 | Lim | | G11C 19/28 |
| | | | | | 345/100 |
| 2007/0079192 | A1* | 4/2007 | Kim | | G09G 3/3266 |
| | | | | | 714/726 |
| 2010/0164929 | A1* | 7/2010 | Chen | | G09G 3/3688 |
| | | | | | 345/98 |
| 2011/0157251 | A1* | 6/2011 | Lim | | H03K 19/018521 |
| | | | | | 345/212 |
| 2013/0162304 | A1* | 6/2013 | Kim | | G09G 3/3677 |
| | | | | | 327/109 |
| 2014/0204011 | A1* | 7/2014 | Hu | | G09G 3/3611 |
| | | | | | 345/100 |
| 2014/0354523 | A1* | 12/2014 | So | | G09G 3/3677 |
| | | | | | 345/100 |
| 2015/0002504 | A1* | 1/2015 | Jo | | G09G 3/3677 |
| | | | | | 345/99 |

| | | | | | |
|---|---|---|---|---|---|
| 2015/0318849 | A1* | 11/2015 | Wu | | H03K 17/002 |
| | | | | | 327/393 |
| 2016/0042684 | A1* | 2/2016 | Kim | | G09G 3/3674 |
| | | | | | 345/55 |
| 2017/0005642 | A1* | 1/2017 | Zhao | | H03K 3/012 |
| 2017/0098420 | A1* | 4/2017 | Kang | | H03K 17/6871 |
| 2018/0173354 | A1* | 6/2018 | Abe | | G06F 3/044 |
| 2018/0277043 | A1* | 9/2018 | Li | | G11C 19/184 |
| 2019/0130856 | A1* | 5/2019 | Chen | | G09G 3/3648 |
| 2019/0180691 | A1* | 6/2019 | Takasugi | | G09G 3/3266 |
| 2020/0020290 | A1* | 1/2020 | Zhao | | G02F 1/13454 |
| 2021/0090484 | A1* | 3/2021 | Shang | | G09G 3/3266 |
| 2021/0104187 | A1* | 4/2021 | Xiong | | G09G 3/006 |
| 2021/0134206 | A1* | 5/2021 | Jin | | G09G 3/20 |
| 2022/0208105 | A1* | 6/2022 | Lee | | G09G 3/3266 |
| 2023/0206851 | A1* | 6/2023 | Park | | G11C 19/28 |
| | | | | | 345/204 |
| 2023/0252933 | A1* | 8/2023 | Guo | | G09G 3/3266 |
| | | | | | 345/55 |
| 2023/0335207 | A1* | 10/2023 | Feng | | G11C 19/287 |
| 2023/0351970 | A1* | 11/2023 | Lu | | G09G 3/3266 |
| 2024/0038130 | A1* | 2/2024 | Tian | | G09G 3/3266 |
| 2024/0296767 | A1* | 9/2024 | Cao | | G09G 3/20 |

FOREIGN PATENT DOCUMENTS

| | | |
|---|---|---|
| CN | 104952406 A | 9/2015 |
| CN | 106057117 A | 10/2016 |
| CN | 107978276 A | 5/2018 |
| CN | 108320708 A | 7/2018 |
| CN | 110364121 A | 10/2019 |
| CN | 111210754 A | 5/2020 |
| CN | 111696469 A | 9/2020 |
| CN | 111883083 A | 11/2020 |
| CN | 112216249 A | 1/2021 |
| CN | 112419994 A | 2/2021 |
| CN | 113196368 A | 7/2021 |
| CN | 113539197 A | 10/2021 |
| CN | 115331644 A | 11/2022 |

* cited by examiner

SIN

SCK1

SCK2

OUT1

SIN

SCK1

SCK2

OUT2

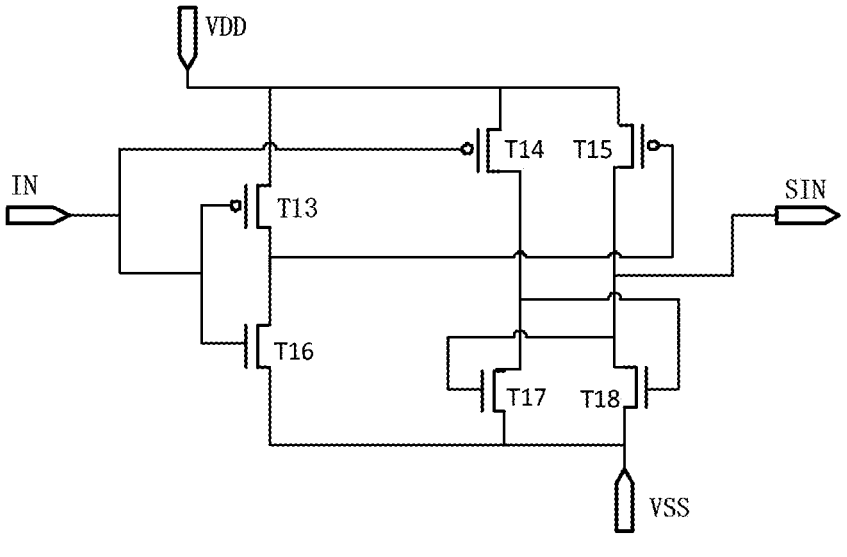

FIG. 8

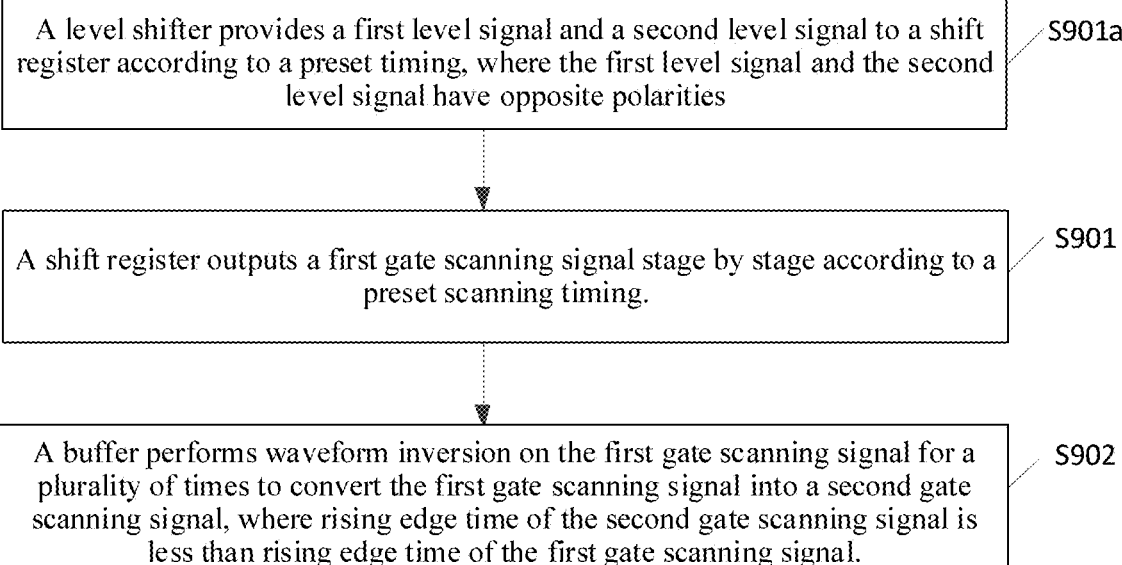

A level shifter provides a first level signal and a second level signal to a shift register according to a preset timing, where the first level signal and the second level signal have opposite polarities                                    S901a A shift register outputs a first gate scanning signal stage by stage according to a preset scanning timing.                                    S901

A buffer performs waveform inversion on the first gate scanning signal for a plurality of times to convert the first gate scanning signal into a second gate scanning signal, where rising edge time of the second gate scanning signal is less than rising edge time of the first gate scanning signal.                                    S902

FIG. 9

GATE DRIVE CIRCUIT AND METHOD FOR DRIVING SAME, AND DISPLAY DEVICE

CROSS-REFERENCE TO RELATED APPLICATION

This application is a U.S. national stage of international application No. PCT/CN2023/110251, filed on Jul. 31, 2023, which claims priority to Chinese Patent Application No. 202211053168 X, filed on Aug. 31, 2022, and entitled "GATE DRIVING CIRCUIT, DRIVING METHOD THEREOF AND DISPLAY DEVICE", the disclosures of which are herein incorporated by reference in their entireties.

TECHNICAL FIELD

The present disclosure belongs to the field of display technologies, and in particular, relates to a gate drive circuit and a method for driving the same, and a display device.

BACKGROUND

With the continuous development of the display industry, liquid crystal display products attract more attention due to their advantages of low cost, narrow frame, lightness and thinning, and the like, and a gate driver on array (GOA) technology emerges in this background.

SUMMARY

Some embodiments of the present disclosure provide a gate drive circuit. The gate drive circuit includes a plurality of shift registers and buffers in cascade.

Each of the shift registers is configured to output a first gate scanning signal stage by stage according to a preset scanning timing.

Each of the buffers is configured to perform waveform inversion on the first gate scanning signal for a plurality of times to convert the first gate scanning signal into a second gate scanning signal. Falling edge time of the second gate scanning signal is less than falling edge time of the first gate scanning signal.

In some embodiments, rising edge time of the second gate scanning signal is less than rising edge time of the first gate scanning signal.

In some embodiments, the shift register includes a first transistor, a second transistor, a third transistor, a fourth transistor, a fifth transistor, a sixth transistor, a seventh transistor, an eighth transistor, a first storage capacitor, and a second storage capacitor.

A control electrode of the first transistor is connected to a first clock signal terminal, a first electrode of the first transistor is connected to a first signal input terminal, and a second electrode of the first transistor is connected to a first node. The first node is a junction of the second electrode of the first transistor, a first electrode of the second transistor, a control electrode of the fourth transistor, and a first electrode of the eighth transistor.

A control electrode of the second transistor is connected to a second clock signal terminal, the first electrode of the second transistor is connected to the first node, and a second electrode of the second transistor is connected to a first electrode of the third transistor.

A control electrode of the third transistor is connected to a second node, the first electrode of the third transistor is connected to a first level signal terminal, and a second electrode of the third transistor is connected to the second electrode of the second transistor. The second node is a junction of the control electrode of the third transistor, a second electrode of the fourth transistor, a second electrode of the fifth transistor, a control electrode of the sixth transistor, and a first electrode plate of the first storage capacitor.

The control electrode of the fourth transistor is connected to the first node, a first electrode of the fourth transistor is connected to the first clock signal terminal, and the second electrode of the fourth transistor is connected to the second node.

A control electrode of the fifth transistor is connected to the first clock signal terminal, a first electrode of the fifth transistor is connected to a second level signal terminal, and the second electrode of the fifth transistor is connected to the second node.

The control electrode of the sixth transistor is connected to the second node, a first electrode of the sixth transistor is connected to the first level signal terminal and a second electrode plate of the first storage capacitor, and a second electrode of the sixth transistor is connected to a first gate scanning signal output terminal.

A control electrode of the seventh transistor is connected to a third node, a first electrode of the seventh transistor is connected to the second clock signal terminal, and a second electrode of the seventh transistor is connected to the first gate scanning signal output terminal and a second electrode plate of the second storage capacitor. The third node is a junction of the control electrode of the seventh transistor, a second electrode of the eighth transistor, and a first electrode plate of the second storage capacitor.

A control electrode of the eighth transistor is connected to the second level signal terminal, the first electrode of the eighth transistor is connected to the first node, and the second electrode of the eighth transistor is connected to the third node.

The first electrode plate of the first storage capacitor is connected to the second node, and the second electrode plate of the first storage capacitor is connected to the first level signal terminal and the first electrode of the sixth transistor.

The first electrode plate of the second storage capacitor is connected to the third node, and the second electrode plate of the second storage capacitor is connected to the first gate scanning signal output terminal and the second electrode of the seventh transistor.

In some embodiments, the buffer includes an even quantity of inverters in cascade.

Each of the inverters is configured to perform waveform inversion on the first gate scanning signal once.

In some embodiments, the buffer includes a first inverter and a second inverter. The first inverter includes a ninth transistor and a tenth transistor. The second inverter includes an eleventh transistor and a twelfth transistor. The ninth transistor and the tenth transistor have opposite polarities. The eleventh transistor and the twelfth transistor have opposite polarities.

A control electrode of the ninth transistor is connected to the first gate scanning signal output terminal of the shift register, a first electrode of the ninth transistor is connected to a first power supply voltage terminal, and a second electrode of the ninth transistor is connected to a control electrode of the eleventh transistor and a control electrode of the twelfth transistor.

A control electrode of the tenth transistor is connected to the first gate scanning signal output terminal of the shift register, a first electrode of the tenth transistor is connected to a second power supply voltage terminal, and a second electrode of the tenth transistor is connected to the control electrode of the eleventh transistor and the control electrode of the twelfth transistor.

The control electrode of the eleventh transistor is connected to the second electrode of the ninth transistor and the second electrode of the tenth transistor, a first electrode of the eleventh transistor is connected to the first power supply voltage terminal, and a second electrode of the eleventh transistor is connected to a second gate scanning signal output terminal.

The control electrode of the twelfth transistor is connected to the second electrode of the ninth transistor and the second electrode of the tenth transistor, a first electrode of the twelfth transistor is connected to the second power supply voltage terminal, and a second electrode of the twelfth transistor is connected to the second gate scanning signal output terminal.

In some embodiments, the gate drive circuit further includes a level shifter.

The level shifter is configured to provide a first level signal and a second level signal to the shift register according to a preset timing. The first level signal and the second level signal have opposite polarities.

In some embodiments, the level shifter includes a thirteenth transistor, a fourteenth transistor, a fifteenth transistor, a sixteenth transistor, a seventeenth transistor, and an eighteenth transistor.

A control electrode of the thirteenth transistor is connected to a second signal input terminal, a first electrode of the thirteenth transistor is connected to the first power supply voltage terminal, and a second electrode of the thirteenth transistor is connected to a control electrode of the fifteenth transistor and a second electrode of the sixteenth transistor.

A control electrode of the fourteenth transistor is connected to the second signal input terminal, a first electrode of the fourteenth transistor is connected to the first power supply voltage terminal, and a second electrode of the fourteenth transistor is connected to a second electrode of the seventeenth transistor and a control electrode of the eighteenth transistor.

The control electrode of the fifteenth transistor is connected to the second electrode of the thirteenth transistor and the second electrode of the sixteenth transistor, a first electrode of the fifteenth transistor is connected to the first power supply voltage terminal, and a second electrode of the fifteenth transistor is connected to the first signal input terminal.

A control electrode of the sixteenth transistor is connected to the second signal input terminal, a first electrode of the sixteenth transistor is connected to the second power supply voltage terminal, and the second electrode of the sixteenth transistor is connected to the second electrode of the thirteenth transistor and the control electrode of the fifteenth transistor.

A control electrode of the seventeenth transistor is connected to a second electrode of the eighteenth transistor and the second electrode of the fifteenth transistor, a first electrode of the seventeenth transistor is connected to the second power supply voltage terminal, and the second electrode of the seventeenth transistor is connected to the second electrode of the fourteenth transistor and the control electrode of the eighteenth transistor.

The control electrode of the eighteenth transistor is connected to the second electrode of the fourteenth transistor and the second electrode of the seventeenth transistor, a first electrode of the eighteenth transistor is connected to the second power supply voltage terminal, and the second electrode of the eighteenth transistor is connected to the first signal input terminal.

Some embodiments of the present disclosure provide a display device. The display device includes the gate drive circuit provided above.

Some embodiments of the present disclosure provide a method for driving a gate drive circuit. The method for driving the gate drive circuit includes:

outputting, by a shift register, a first gate scanning signal stage by stage according to a preset scanning timing; and performing, by a buffer, waveform inversion on the first gate scanning signal for a plurality of times to convert the first gate scanning signal into a second gate scanning signal, wherein rising edge time of the second gate scanning signal is less than rising edge time of the first gate scanning signal.

In some embodiments, falling edge time of the second gate scanning signal is less than falling edge time of the first gate scanning signal.

In some embodiments, prior to outputting the first gate scanning signal stage by stage according to the preset scanning timing, the method for driving the gate drive circuit further includes:

providing, by a level shifter, a first level signal and a second level signal to the shift register according to a preset timing, wherein the first level signal and the second level signal have opposite polarities.

BRIEF DESCRIPTION OF THE DRAWINGS

FIG. 8 is a circuit diagram of a level shifter in the gate drive circuit according to some embodiments of the present disclosure; and FIG. 9 is a schematic flowchart of a method for driving a gate drive circuit according to some embodiments of the present disclosure.

DETAILED DESCRIPTION

Figure 1:
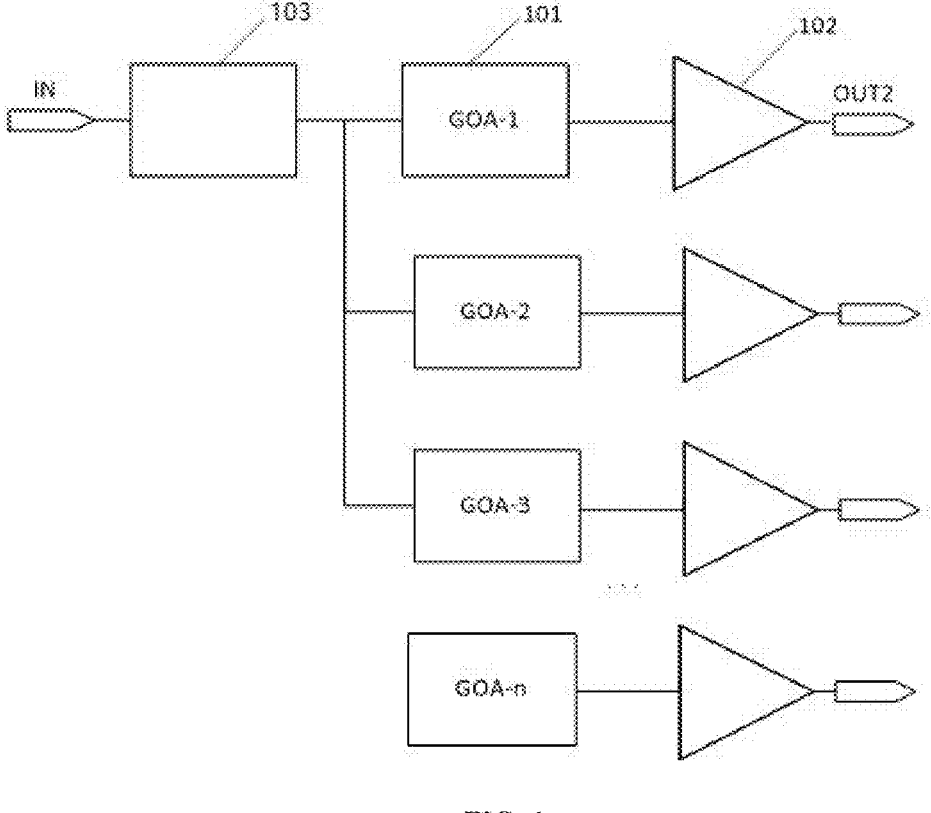
FIG. 1 is a schematic structural diagram of a gate drive circuit according to some embodiments of the present disclosure.

In order to make those skilled in the art better understand the technical solutions of the present disclosure, the present disclosure is further described in detail below with reference to the accompanying drawings and the specific implementations.

Unless otherwise defined, technical or scientific terms used in the present disclosure should have ordinary meanings as understood by those of ordinary skill in the art to which the present disclosure belongs. The terms "first", "second", and other similar words, as used in the present disclosure, do not indicate any order, quantity, or importance, but are merely defined to distinguish different components. Likewise, the terms "a", "an", "the", or other similar words do not indicate a limitation of quantity, but rather the presence of at least one. The terms "include", "comprise", or other similar words indicate that the elements or objects stated before them encompass the elements or objects and equivalents thereof listed after them, but do not exclude other elements or objects. The terms "connecting", "connected", or other similar words are not limited to physical or mechanical connections, but may include electrical connections, whether direct or indirect. The terms "up", "down", "left", "right", and the like are merely defined to indicate relative positional relationships. In the case that the absolute position of a described object changes, the relative position relationship may also change accordingly.

It should be noted herein that transistors adopted in embodiments of the present disclosure may be thin-film transistors or field-effect transistors or other devices with the same characteristics, and as the source and the drain of the transistor adopted are symmetrical, there is no difference between the source and the drain. In the embodiments of the present disclosure, to distinguish the source and the drain of the transistor, one of the source and the drain is referred to as a first electrode, the other is referred to as a second electrode, and the gate is referred to as a control electrode. In addition, the transistors may be classified into N-type transistors and P-type transistors according to characteristics of the transistors, and the N-type transistor is used as an example for description in the following embodiments. In the case that the P-type transistor is adopted, the first electrode is the source of the P-type transistor, and the second electrode is the drain of the P-type transistor, and in the case that a low level is inputted to the gate, the source and the drain are turned on. In the case that the N-type transistor is adopted, the reverse applies. It is contemplated that implementation adopting the N-type transistor is readily apparent to those skilled in the art without creative efforts, and thus falls within the protection scope of the embodiments of the present disclosure. In the case that the transistors adopted in the embodiments of the present disclosure are the P-type transistors, a first level signal is a non-operating level signal, that is, a high-level signal, and a second level signal may be an operating level signal, that is, a low-level signal; and correspondingly, a first level signal terminal is a high-level signal terminal, and a second level signal terminal is a low-level signal terminal.

Generally, a display panel includes a plurality of gate lines and a plurality of data lines, the gate lines and the data lines are arranged crosswise to define a plurality of pixel regions, and each pixel region is provided with a pixel unit. An example in which an extending direction of each gate line is a row direction and an extending direction of each data line is a column direction is used to describe a structure of the display panel. In the case that the display panel is driven to display, gate scanning signals are written into the gate lines line by line according to a to-be-displayed image. Meanwhile, data voltage signals are written into the data lines, such that pixel units in the display panel are lit line by line. The gate scanning signal is provided by a gate drive circuit, and the data voltage signal is provided by a source drive circuit. In the related art, the gate drive circuit is integrated in a gate drive chip, and the source drive circuit is integrated in a source drive chip. Currently, to reduce the quantity of chips and achieve a narrow frame or no frame, a technology for integrating the gate drive circuit on an array substrate (gate on array, GOA) is provided, where the gate drive circuit includes a plurality of cascaded shift registers that are integrated on the array substrate, and each shift register is connected to the gate line in a one-to-one correspondence manner and configured to provide the gate scanning signal for the gate line connected to the shift register.

In a display product, the gate drive circuit is disposed in a non-display region of the display panel. However, a drive capability of the current gate drive circuit is limited, and to drive a larger load, a larger width-to-length ratio of a thin-film transistor in the gate drive circuit needs to be set, which increases an area occupied by the thin-film transistor. As such, the area of the non-display region of the display panel is large, which is not conducive to a narrow frame of the display product.

Meanwhile, in the current electronic design industry, the most common power supply voltage of a chip is 5 volts (V) and 3.3 V, a voltage of a chip with low power consumption is even lower, and the chip cannot raise a negative voltage. However, for a portion of pixel circuits driven by the gate drive circuit, a negative voltage is often needed to reduce power consumption or make a switch characteristic more sensitive, for example, a low level voltage is-2V. In the case that chips with different power supply voltages communicate, a level mismatch between the chips affects communication quality, causes communication failure, and even damages the chips.

To solve at least one of the above technical problems, the embodiments of the present disclosure provide a gate drive circuit and a method for driving the same, and a display device. The gate drive circuit and the drive method thereof, and the display device that are provided by the embodiments of the present disclosure are further described in detail below with reference to the accompanying drawings and the specific implementations.

FIG. 1 is a schematic structural diagram of a gate drive circuit according to some embodiments of the present disclosure. As shown in FIG. 1, the gate drive circuit includes a plurality of shift registers 101 and buffers 102 in cascade. The shift register 101 is configured to output a first gate scanning signal stage by stage according to a preset scanning timing. The buffer 102 is configured to perform waveform inversion on the first gate scanning signal for a plurality of times to convert the first gate scanning signal into a second gate scanning signal. Rising edge time of the second gate scanning signal is less than rising edge time of the first gate scanning signal.

In the gate drive circuit provided by the embodiments of the present disclosure, the shift register 101 outputs the first gate scanning signal stage by stage according to the preset timing, and the buffer 102 performs waveform inversion on the first gate scanning signal for a plurality of times to convert the first gate scanning signal into the second gate scanning signal, where falling edge time of the second gate scanning signal is less than falling edge time of the first gate scanning signal. As such, effective operating time of the gate scanning signal can be prolonged, charging time of a pixel unit in a display region is ensured, and a drive capability of the gate drive circuit is improved. Meanwhile, a thin-film transistor with a large width-to-length ratio does not need to be adopted in the gate drive circuit. Therefore, a size of the thin-film transistor is reduced, and an area occupied by the gate drive circuit is reduced, such that a narrow frame of a display product is facilitated, a screen-to-body ratio of the display product is increased, and user experience is improved.

In some embodiments, the rising edge time of the second gate scanning signal is less than the rising edge time of the first gate scanning signal.

The rising edge time of the second gate scanning signal outputted by the buffer 102 is less than the rising edge time of the first gate scanning signal. As such, the effective operating time of the gate scanning signal is further prolonged, the charging time of the pixel unit in the display region is ensured, and the drive capability of the gate drive circuit is improved. Meanwhile, a thin-film transistor with a large width-to-length ratio does not need to be adopted in the gate drive circuit. Therefore, the size of the thin-film transistor is reduced, and the area occupied by the gate drive circuit is reduced, such that a narrow frame of a display product is facilitated, a screen-to-body ratio of the display product is increased, and user experience is improved.

Figure 2:
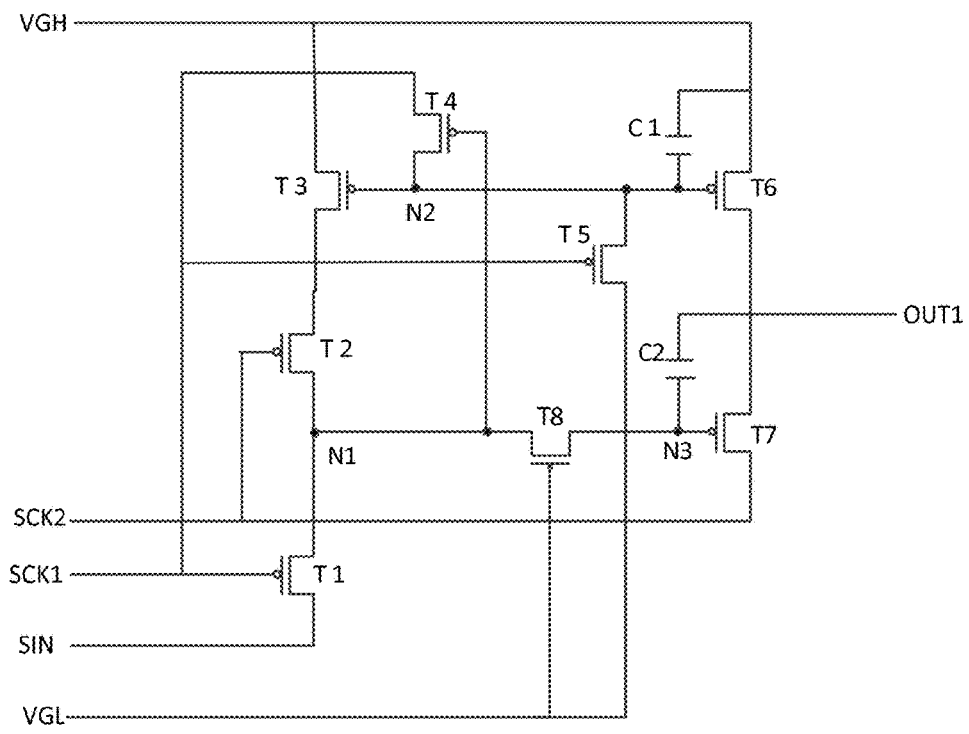
FIG. 2 is a circuit diagram of a shift register in the gate drive circuit according to some embodiments of the present disclosure.

FIG. 2 is a circuit diagram of a shift register in the gate drive circuit according to some embodiments of the present disclosure. As shown in FIG. 2, the shift register includes: a first transistor T1, a second transistor T2, a third transistor T3, a fourth transistor T4, a fifth transistor T5, a sixth transistor T6, a seventh transistor T7, an eighth transistor T8, a first storage capacitor C1, and a second storage capacitor C2.

Specifically, the gate of the first transistor T1 is connected to a first clock signal terminal SCK1, the source of the first transistor T1 is connected to a first signal input terminal SIN, and the drain of the first transistor T1 is connected to a first node N1. The first node N1 is a junction of the drain of the first transistor T1, the source of the second transistor T2, the gate of the fourth transistor T4, and the source of the eighth transistor T8.

The gate of the second transistor T2 is connected to a second clock signal terminal SCK2, the source of the second transistor T2 is connected to the first node N1, and the drain of the second transistor T2 is connected to the source of the third transistor T3.

The gate of the third transistor T3 is connected to a second node N2, the source of the third transistor T3 is connected to a high-level signal terminal VGH, and the drain of the third transistor T3 is connected to the drain of the second transistor T2. The second node N2 is a junction of the gate of the third transistor T3, the drain of the fourth transistor T4, the drain of the fifth transistor T5, the gate of the sixth transistor T6, and a source plate of the first storage capacitor C1.

The gate of the fourth transistor T4 is connected to the first node N1, the source of the fourth transistor T4 is connected to the first clock signal terminal SCK1, and the drain of the fourth transistor T4 is connected to the second node N2.

The gate of the fifth transistor T5 is connected to the first clock signal terminal SCK1, the source of the fifth transistor T5 is connected to a low-level signal terminal VGL, and the drain of the fifth transistor T5 is connected to the second node N2.

The gate of the sixth transistor T6 is connected to the second node N2, the source of the sixth transistor T6 is connected to the high-level signal terminal VGH and a drain plate of the first storage capacitor C1, and the drain of the sixth transistor T6 is connected to an output terminal OUT1 of the first gate scanning signal.

A control electrode of the seventh transistor T7 is connected to a third node N3, the source of the seventh transistor T7 is connected to the second clock signal terminal SCK2, and the drain of the seventh transistor T7 is connected to the first gate scanning signal terminal output terminal OUT1 and a drain plate of the second storage capacitor C2. The third node N3 is a junction of the gate of the seventh transistor T7, the drain of the eighth transistor T8, and a source plate of the second storage capacitor C2.

The gate of the eighth transistor T8 is connected to the low-level signal terminal VGL, the source of the eighth transistor T8 is connected to the first node N1, and the drain of the eighth transistor T8 is connected to the third node N3.

The source plate of the first storage capacitor C1 is connected to the second node N2, and the drain plate of the first storage capacitor C1 is connected to the high-level signal terminal VGH and the source of the sixth transistor T6.

The source plate of the second storage capacitor C2 is connected to the third node N3, and the drain plate of the second storage capacitor C2 is connected to the first gate scanning signal output terminal and the drain of the seventh transistor T7.

Figure 3:
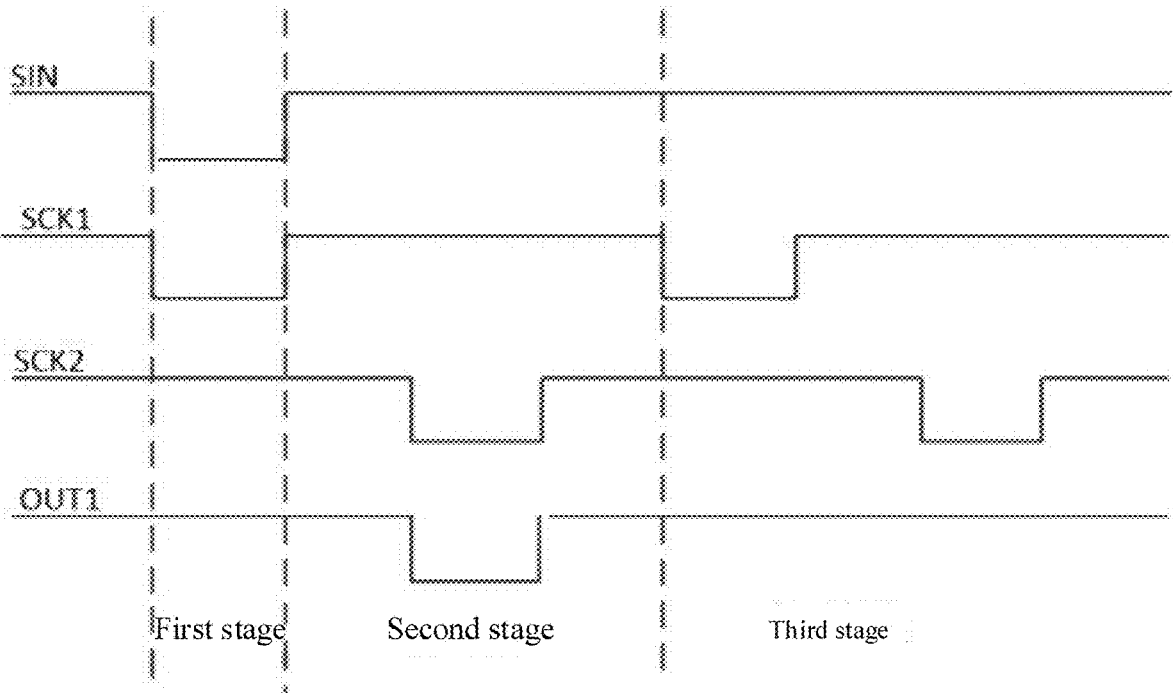
FIG. 3 is a timing diagram of the shift register shown in FIG. 2.

It should be noted herein that all the transistors in the shift register 101 are P-type transistors. In the case that a low-level signal is inputted to the gate of the P-type transistor, the source and the drain are turned on. FIG. 3 is a timing diagram of the shift register shown in FIG. 2. A working principle of the shift register in the gate drive circuit provided by the embodiments of the present disclosure is further described in detail below with reference to the timing diagram.

A first stage: A low-level signal is inputted to the first signal input terminal SIN, a first clock signal of the first clock signal terminal SCK1 is a low-level signal, and a second clock signal of the second clock signal terminal SCK2 is a high-level signal. In this case, the first transistor T1 is turned on, the low-level signal is transmitted to the source of the fourth transistor T4, the low-level signal of the first signal input terminal SIN passes through the first transistor T1 and controls the fourth transistor T4 to be turned on, and the low-level signal of the source of the fourth transistor T4 flows through the first storage capacitor C1 (charging) and the gate of the sixth transistor T6. In this case, the sixth transistor T6 is turned on, and a high-level signal of the high-level signal terminal VGH is transmitted to the first gate scanning signal terminal OUT1. Meanwhile, the low-level signal terminal VGL keeps at a low-level all the time, and the first transistor T1 is turned on all the time. In this case, the low-level signal of the first signal input terminal SIN flows through the first transistor T1, flows through the eight transistor T8, and reaches the gate of the seventh transistor T7 and the second storage capacitor C2 to charge the second storage capacitor C2 and turn on the seventh transistor T7. In this case, the high-level signal of the second clock signal terminal SCK2 is transmitted to the first gate scanning signal terminal OUT1 through the seventh transistor T7. Because the high-level signal of the second clock signal terminal SCK2 has the same value as the high-level signal of the high-level signal terminal VGH, OUT1=VGH=SCK2.

A second stage: A signal of the second clock signal terminal SCK2 is a low-level signal, signals of the first clock signal terminal SCK1 and the first signal input terminal SIN are high-level signals, the first storage capacitor C1 and the second storage capacitor C2 keep low-level signals, and the eighth transistor T8 is turned on all the time. In this case, the third transistor T3, the fourth transistor T4, the sixth transistor T6, and the seventh transistor T7 are turned on by the two storage capacitors, the second transistor T2 is turned on under the action of the second clock signal terminal SCK2, and the first transistor T1 and the fifth transistor T5 are turned off. Therefore, the high-level signal of the first clock signal terminal SCK1 flows through the fourth transistor T4 to charge the first storage capacitor C1 (high level) and turn off the sixth transistor T6 and the third transistor T3, and the low-level signal of the second clock signal terminal SCK2 flows through the seventh transistor T7 and is outputted to the first gate scanning signal terminal OUT1. Therefore, OUT1=SCK2.

A third stage: (1) The signal of the first clock signal terminal SCK1 is a low-level signal, and the signals of the first signal input terminal SIN and the second clock signal terminal SCK2 are high-level signals. In this case, the first transistor T1 and the fifth transistor T5 are turned on, a low-level signal of the low-level signal terminal VGL flows through the fifth transistor T5 to charge the first storage capacitor C1 (low level) and turn on the sixth transistor T6 and the third transistor T3, and the high-level signal of the high-level signal terminal VGH flows through the sixth transistor T6 and is outputted to the first gate scanning signal terminal OUT1. The high-level signal of the second clock signal terminal SCK2 turns off the second transistor T2. The high-level signal of the first signal input terminal SIN flows through the first transistor T1 and turns off the fourth transistor T4, and charges the second storage capacitor C2 (high level) and turns off the seventh transistor T7 through the eighth transistor T8. The high-level signal of the second clock signal terminal SCK2 cannot be outputted. (2) The signal of the second clock signal terminal SCK2 is a low-level signal, and the signals of the first signal input terminal SIN and the first clock signal terminal SCK1 are high-level signals. In this case, the second transistor T2 is turned on, the sixth transistor T6 and the third transistor T3 are turned on under the action of the low-level signal of the first storage capacitor C1, the high-level signal of the high-level signal terminal VGH flows through the sixth transistor T6 and is outputted to the first gate scanning signal terminal OUT1, the high-level signal of the high-level signal terminal VGH flows through the third transistor T3, the second transistor T2, and the eighth transistor T8 to charge the second storage capacitor C2, and turns off the fourth transistor T4 and the seventh transistor T7, the first transistor T1 and the fifth transistor T5 are turned off under the action of the high-level signal of the first clock signal terminal SCK1. Therefore, OUT1=VGH.

Figure 4:
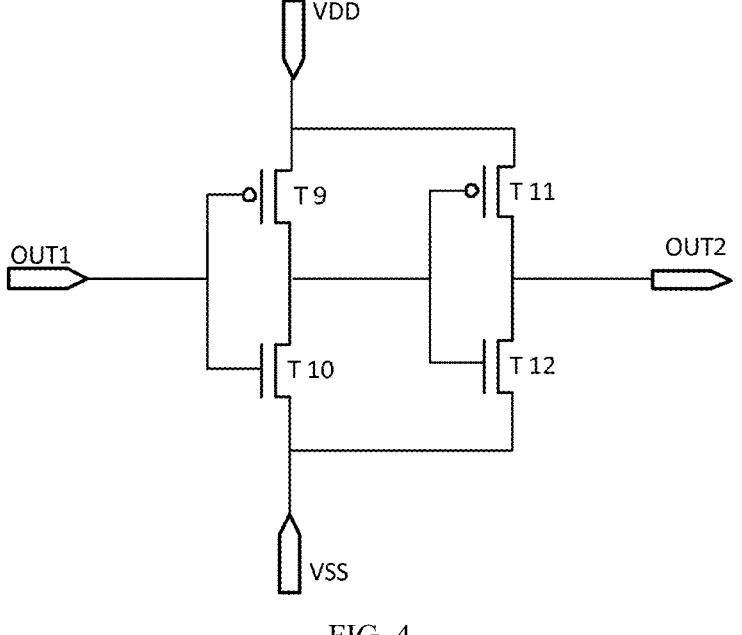
FIG. 4 is a circuit diagram of a buffer in the gate drive circuit according to some embodiments of the present disclosure.

FIG. 4 is a circuit diagram of a buffer in the gate drive circuit according to some embodiments of the present disclosure. As shown in FIG. 4, the buffer 102 includes an even number of inverters in cascade. The inverter is configured to perform waveform inversion on the first gate scanning signal once.

Each inverter performs waveform inversion in sequence on the first gate scanning signal, such that the gate scanning signal is quickly converted from a high-level signal to a low-level signal, or is quickly converted from a low-level signal to a high-level signal. As such, the falling edge time and the rising edge time of the gate scanning signal can be reduced, the effective operating time of the gate scanning signal is prolonged, the charging time of the pixel unit in the display region is ensured, and the drive capability of the gate drive circuit is improved. Meanwhile, a thin-film transistor with a large width-to-length ratio does not need to be adopted in the gate drive circuit. Therefore, a size of the thin-film transistor is reduced, and an area occupied by the gate drive circuit is reduced, such that a narrow frame of a display product is facilitated, a screen-to-body ratio of the display product is increased, and user experience is improved.

Specifically, as shown in FIG. 4, the buffer includes: a first inverter and a second inverter. The first inverter includes a ninth transistor T9 and a tenth transistor T10. The second inverter includes an eleventh transistor T11 and a twelfth transistor T12. The ninth transistor T9 and the tenth transistor T10 have opposite polarities. The eleventh transistor T11 and the twelfth transistor T12 have opposite polarities.

The gate of the ninth transistor T9 is connected to the first gate scanning signal output terminal of the shift register, the source of the ninth transistor T9 is connected to a first power supply voltage terminal VDD, and the drain of the ninth transistor T9 is connected to the gate of the eleventh transistor T11 and the gate of the twelfth transistor T12.

The gate of the tenth transistor T10 is connected to the first gate scanning signal output terminal of the shift register, the source of the tenth transistor T10 is connected to a second power supply voltage terminal VSS, and the drain of the tenth transistor T10 is connected to the gate of the eleventh transistor T11 and the gate of the twelfth transistor T12.

The gate of the eleventh transistor T11 is connected to the drain of the ninth transistor T9 and the drain of the tenth transistor T10, the source of the eleventh transistor T11 is connected to the first power supply voltage terminal VDD, and the drain of the eleventh transistor T11 is connected to a second gate scanning signal output terminal.

The gate of the twelfth transistor T12 is connected to the drain of the ninth transistor T9 and the drain of the tenth transistor T10, the source of the twelfth transistor T12 is connected to the second power supply voltage terminal VSS, and the drain of the twelfth transistor T12 is connected to the second gate scanning signal output terminal.

Figure 5:
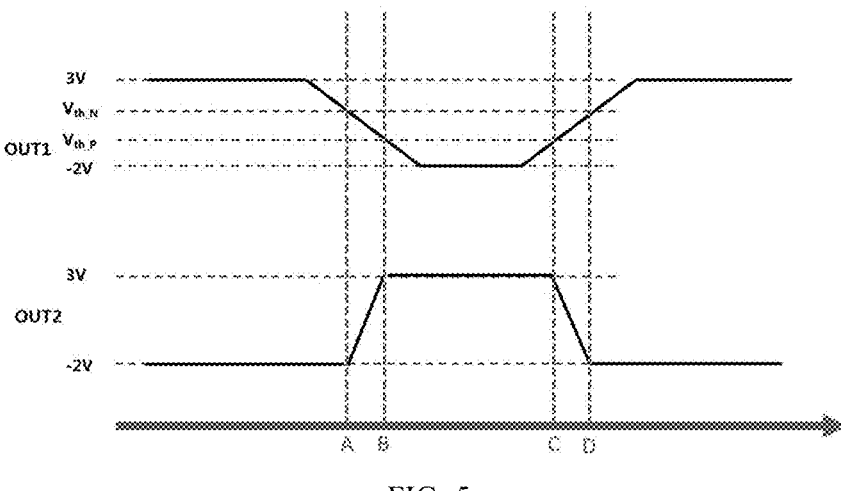
FIG. 5 is a timing diagram of an inverter in the gate drive circuit according to some embodiments of the present disclosure.

FIG. 5 is a timing diagram of an inverter in the gate drive circuit according to some embodiments of the present disclosure. The first inverter including the ninth transistor T9 and the tenth transistor T10 is used as an example. A signal outputted from the first signal output terminal OUT1 has a waveform acquired before passing through the first inverter, and a signal outputted from OUT2 has a waveform acquired after passing through the first inverter (the line with an arrow in the figure is regarded as a time axis). The tenth transistor T10 that is an N-type transistor is in an on state in a voltage range of $V_{th\_N}$ to 3 V (the waveform on the left of point A and on the right of point D), and therefore a low-level signal of the second power supply voltage terminal VSS is outputted. The ninth transistor T9 that is an N-type transistor is in an on state in a voltage range of −2 V to $V_{th\_P}$ (the waveform between point B and point C), and therefore a high-level signal of the first power supply voltage terminal VDD is outputted. Through the waveform inversion of the form, the rising edge time and the falling edge time is reduced. Meanwhile, a high-level signal outputted by the inverter of the last stage is provided by the first power supply voltage terminal VDD, a low-level signal is directly provided by the second power supply voltage terminal VSS, and therefore a load capability is improved. (It is to be noted that $V_{th\_N}$ and $V_{th\_P}$ are respectively threshold voltages of the N-type transistor and the P-type transistor, and for convenience of understanding, it is assumed that $V_{th\_N}$=0.8 V and $V_{th\_P}$=−0.9 V.)

Figures 6, 7:
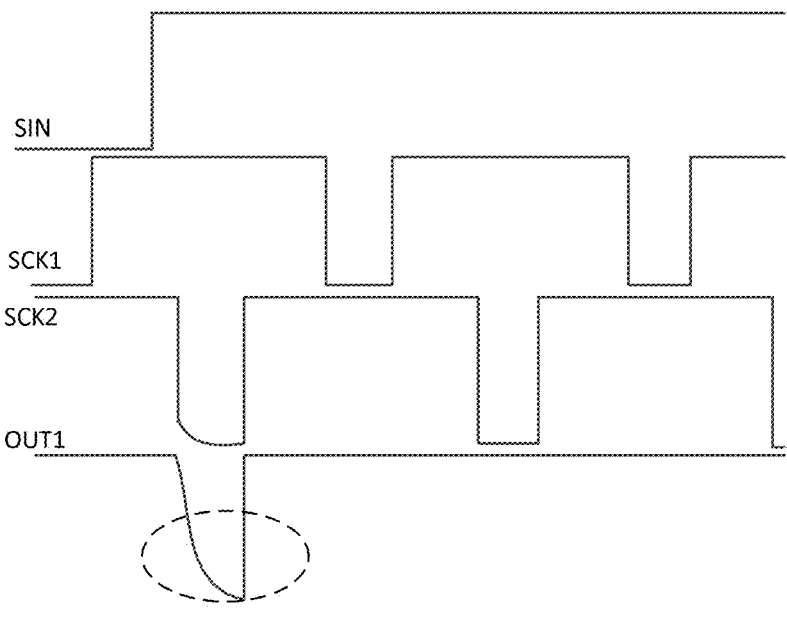
FIG. 6 is a simulation diagram of a gate scanning signal outputted by a gate drive circuit according to some embodiments of the present disclosure.
FIG. 7 is a simulation diagram of a gate scanning signal outputted by the gate drive circuit according to some embodiments of the present disclosure.

It is assumed that a load is 10 kΩ and 5 pF. FIG. 6 is a simulation diagram of a gate scanning signal outputted by a gate drive circuit according to some embodiments. FIG. 7 is a simulation diagram of a gate scanning signal output by the gate drive circuit according to some embodiments of the present disclosure. As shown in FIG. 6, the width-to-length ratio of the thin-film transistor in the gate drive circuit is 20 μm/2 μm, and a waveform outputted by the thin-film transistor is severely distorted, which cannot meet a requirement for driving a pixel circuit to turn on a switching transistor. As shown in FIG. 7, the width-to-length ratio of the thin-film transistor in the gate drive circuit is also 20 μm/2 μm, a waveform outputted by the thin-film transistor is complete, the falling edge time is changed from 895 ns to 74 ns, the rising edge time is changed from 233 ns to 100 ns, and an output signal is defined to drive the switching transistor of the pixel circuit. Therefore, larger slopes of a rising edge and a falling edge indicate a better switching characteristic, switching performance of the switching transistor is improved by at least 233%, and the drive capability of the gate drive circuit is greatly improved.

In some embodiments, as shown in FIG. 1, the gate drive circuit further includes a level shifter 103. The level shifter 103 is configured to provide a first level signal and a second level signal to the shift register 101 according to a preset timing. The first level signal and the second level signal have opposite polarities.

Specifically, FIG. 8 is a circuit diagram of a level shifter in the gate drive circuit according to some embodiments of the present disclosure. As shown in FIG. 8, the level shifter 103 includes a thirteenth transistor T13, a fourteenth transistor T14, a fifteenth transistor T15, a sixteenth transistor T16, a seventeenth transistor T17, and an eighteenth transistor T18.

The gate of the thirteenth transistor T13 is connected to a second signal input terminal IN, the source of the thirteenth transistor T13 is connected to the first power supply voltage terminal VDD, and the drain of the thirteenth transistor T13 is connected to the gate of the fifteenth transistor T15 and the drain of the sixteenth transistor T16.

The gate of the fourteenth transistor T14 is connected to the second signal input terminal IN, the source of the fourteenth transistor T14 is connected to the first power supply voltage terminal VDD, and the drain of the fourteenth transistor T14 is connected to the drain of the seventeenth transistor T17 and the gate of the eighteenth transistor T18.

The gate of the fifteenth transistor T15 is connected to the drain of the thirteenth transistor T13 and the drain of the sixteenth transistor T16, the source of the fifteenth transistor T15 is connected to the first power supply voltage terminal VDD, and the drain of the fifteenth transistor T15 is connected to the first signal input terminal SIN.

The gate of the sixteenth transistor T16 is connected to the second signal input terminal IN, the source of the sixteenth transistor T16 is connected to the second power supply voltage terminal VSS, and the drain of the sixteenth transistor T16 is connected to the drain of the thirteenth transistor T13 and the gate of the fifteenth transistor T15.

The gate of the seventeenth transistor T17 is connected to the drain of the eighteenth transistor T18 and the drain of the fifteenth transistor T15, the source of the seventeenth transistor T17 is connected to the second power supply voltage terminal VSS, and the drain of the seventeenth transistor T17 is connected to the drain of the fourteenth transistor T14 and the gate of the eighteenth transistor T18.

The gate of the eighteenth transistor T18 is connected to the drain of the fourteenth transistor T14 and the drain of the seventeenth transistor T17, the source of the eighteenth transistor T18 is connected to the second power supply voltage terminal VSS, and the drain of the eighteenth transistor T18 is connected to the first signal input terminal SIN.

A voltage of the first power supply voltage terminal VDD is 3 V, a voltage of the second power supply voltage terminal VSS is-2V, and a timing signal is inputted from the second signal input terminal IN. In the case that the inputted timing signal is a high-level signal, the thirteenth transistor T13 and the fourteenth transistor T14 are turned off, the sixteenth transistor T16 is turned on, the voltage of the second power supply voltage terminal VSS turns on the fifteenth transistor T15 through the sixteenth transistor T16, and the voltage of the first power supply voltage terminal VDD is directly outputted to the first signal input terminal SIN of the shift register 101. In the case that the inputted timing signal is a low-level signal, the sixteenth transistor T16 is turned off, the thirteenth transistor T13 and the fourteenth transistor T14 are turned on, the voltage of the first power supply voltage terminal VDD turns off the fifteenth transistor T15 through the thirteenth transistor T13, and turns on the eighteenth transistor T18 through the fourteenth transistor T14, and the voltage of the second power supply voltage terminal VSS is outputted to the first signal input terminal SIN of the shift register 101. A function of the seventeenth transistor T17 is to output a signal with a timing opposite to that of the signal inputted from the first signal input terminal SIN of the shift register 101.

In a second aspect, the embodiments of the present disclosure provide a display device. The display device includes the gate drive circuit provided in any one of the above embodiments. The display device is a terminal device like a mobile phone, a tablet computer, a notebook computer, and a smart television. An implementation principle of the display device is the same as that of the gate drive circuit provided in the above embodiments, and details are not repeated here.

In a third aspect, the embodiments of the present disclosure provide a method for driving a gate drive circuit. FIG. 9 is a schematic flowchart of a method for driving a gate drive circuit according to some embodiments of the present disclosure. As shown in FIG. 9, the method for driving the gate drive circuit includes the following steps S901 and S902.

In S901, a shift register outputs a first gate scanning signal stage by stage according to a preset scanning timing.

S902, a buffer performs waveform inversion on the first gate scanning signal for a plurality of times to convert the first gate scanning signal into a second gate scanning signal, where rising edge time of the second gate scanning signal is less than rising edge time of the first gate scanning signal.

In the method for driving the gate drive circuit provided by the embodiments of the present disclosure, the shift register 101 outputs the first gate scanning signal stage by stage according to the preset timing, and then the buffer 102 performs waveform inversion on the first gate scanning signal for a plurality of times to convert the first gate scanning signal into the second gate scanning signal, where falling edge time of the second gate scanning signal is less than falling edge time of the first gate scanning signal. As such, effective operating time of the gate scanning signal is prolonged, charging time of a pixel unit in a display region is ensured, and a drive capability of the gate drive circuit is improved. Meanwhile, a thin-film transistor with a large width-to-length ratio does not need to be adopted in the gate drive circuit. Therefore, a size of the thin-film transistor is reduced, and an area occupied by the gate drive circuit is reduced, such that a narrow frame of a display product is facilitated, a screen-to-body ratio of the display product is increased, and user experience is improved.

In some embodiments, the falling edge time of the second gate scanning signal is less than the falling edge time of the first gate scanning signal.

The rising edge time of the second gate scanning signal is less than the rising edge time of the first gate scanning signal. As such, the effective operating time of the gate scanning signal is further prolonged, the charging time of the pixel unit in the display region is ensured, and the drive capability of the gate drive circuit is improved. Meanwhile, a thin-film transistor with a large width-to-length ratio does not need to be adopted in the gate drive circuit. Therefore, a size of the thin-film transistor is reduced, and an area occupied by the gate drive circuit is reduced, such that a narrow frame of a display product is facilitated, a screen-to-body ratio of the display product is increased, and user experience is improved.

In some embodiments, as shown in FIG. 9, prior to step S901, the method further includes step S901*a*.

In S901*a*, a level shifter provides a first level signal and a second level signal to the shift register according to a preset timing, where the first level signal and the second level signal have opposite polarities.

In step S901*a*, the level shifter provides the first level signal and the second level signal that have opposite polarities to the shift register, for example, 3 V and −2 V, such that level shifting is implemented, and a problem that some chips cannot generate a negative voltage or a positive voltage is solved.

It should be understood that the above embodiments are merely exemplary embodiments employed to illustrate the principles of the present disclosure, and the present disclosure is not limited thereto. It will be apparent to those of ordinary skill in the art that various changes and modifications can be made without departing from the spirit and scope of the present disclosure, and these changes and modifications are also considered to fall within the protection scope of the present disclosure.

The invention claimed is:

1. A gate drive circuit, comprising a plurality of shift registers and buffers in cascade, wherein each of the shift registers is configured to output a first gate scanning signal stage by stage according to a preset scanning timing; and each of the buffers is configured to perform waveform inversion on the first gate scanning signal for a plurality of times to convert the first gate scanning signal into a second gate scanning signal, wherein falling edge time of the second gate scanning signal is less than falling edge time of the first gate scanning signal, and rising edge time of the second gate scanning signal is less than rising edge time of the first gate scanning signal;

wherein the shift register comprises a first transistor, a second transistor, a third transistor, a fourth transistor, a fifth transistor, a sixth transistor, a seventh transistor, an eighth transistor, a first storage capacitor, and a second storage capacitor; and wherein a control electrode of the first transistor is connected to a first clock signal terminal, a first electrode of the first transistor is connected to a first signal input terminal, and a second electrode of the first transistor is connected to a first node; the first node is a junction of the second electrode of the first transistor, a first electrode of the second transistor, a control electrode of the fourth transistor, and a first electrode of the eighth transistor;

a control electrode of the second transistor is connected to a second clock signal terminal, the first electrode of the second transistor is connected to the first node, and a second electrode of the second transistor is connected to a first electrode of the third transistor;

a control electrode of the third transistor is connected to a second node, the first electrode of the third transistor is connected to a first level signal terminal, and a second electrode of the third transistor is connected to the second electrode of the second transistor; the second node is a junction of the control electrode of the third transistor, a second electrode of the fourth transistor, a second electrode of the fifth transistor, a control electrode of the sixth transistor, and a first electrode plate of the first storage capacitor;

the control electrode of the fourth transistor is connected to the first node, a first electrode of the fourth transistor is connected to the first clock signal terminal, and the second electrode of the fourth transistor is connected to the second node;

a control electrode of the fifth transistor is connected to the first clock signal terminal, a first electrode of the fifth transistor is connected to a second level signal terminal, and the second electrode of the fifth transistor is connected to the second node;

the control electrode of the sixth transistor is connected to the second node, a first electrode of the sixth transistor is connected to the first level signal terminal and a second electrode plate of the first storage capacitor, and a second electrode of the sixth transistor is connected to a first gate scanning signal output terminal;

a control electrode of the seventh transistor is connected to a third node, a first electrode of the seventh transistor is connected to the second clock signal terminal, and a second electrode of the seventh transistor is connected to the first gate scanning signal output terminal and a second electrode plate of the second storage capacitor; the third node is a junction of the control electrode of the seventh transistor, a second electrode of the eighth transistor, and a first electrode plate of the second storage capacitor;

a control electrode of the eighth transistor is connected to the second level signal terminal, the first electrode of the eighth transistor is connected to the first node, and the second electrode of the eighth transistor is connected to the third node;

the first electrode plate of the first storage capacitor is connected to the second node, and the second electrode plate of the first storage capacitor is connected to the first level signal terminal and the first electrode of the sixth transistor; and the first electrode plate of the second storage capacitor is connected to the third node, and the second electrode plate of the second storage capacitor is connected to the first gate scanning signal output terminal and the second electrode of the seventh transistor.

2. The gate drive circuit according to claim 1, wherein the buffer comprises an even quantity of inverters in cascade; and wherein each of the inverters is configured to perform waveform inversion on the first gate scanning signal once.

3. The gate drive circuit according to claim 2, wherein the buffer comprises a first inverter and a second inverter, the first inverter comprises a ninth transistor and a tenth transistor, the second inverter comprises an eleventh transistor and a twelfth transistor, the ninth transistor and the tenth transistor have opposite polarities, and the eleventh transistor and the twelfth transistor have opposite polarities; and wherein a control electrode of the ninth transistor is connected to the first gate scanning signal output terminal of the shift register, a first electrode of the ninth transistor is connected to a first power supply voltage terminal, and a second electrode of the ninth transistor is connected to a control electrode of the eleventh transistor and a control electrode of the twelfth transistor;

a control electrode of the tenth transistor is connected to the first gate scanning signal output terminal of the shift register, a first electrode of the tenth transistor is connected to a second power supply voltage terminal, and a second electrode of the tenth transistor is connected to the control electrode of the eleventh transistor and the control electrode of the twelfth transistor;

the control electrode of the eleventh transistor is connected to the second electrode of the ninth transistor and the second electrode of the tenth transistor, a first electrode of the eleventh transistor is connected to the first power supply voltage terminal, and a second electrode of the eleventh transistor is connected to a second gate scanning signal output terminal; and the control electrode of the twelfth transistor is connected to the second electrode of the ninth transistor and the second electrode of the tenth transistor, a first electrode of the twelfth transistor is connected to the second power supply voltage terminal, and a second electrode of the twelfth transistor is connected to the second gate scanning signal output terminal.

4. The gate drive circuit according to claim 3, further comprising a level shifter; and wherein the level shifter is configured to provide a first level signal and a second level signal to the shift register according to a preset timing, wherein the first level signal and the second level signal have opposite polarities.

5. The gate drive circuit according to claim 4, wherein the level shifter comprises a thirteenth transistor, a fourteenth transistor, a fifteenth transistor, a sixteenth transistor, a seventeenth transistor, and an eighteenth transistor; and wherein a control electrode of the thirteenth transistor is connected to a second signal input terminal, a first electrode of the thirteenth transistor is connected to the first power supply voltage terminal, and a second electrode of the thirteenth transistor is connected to a control electrode of the fifteenth transistor and a second electrode of the sixteenth transistor;

a control electrode of the fourteenth transistor is connected to the second signal input terminal, a first electrode of the fourteenth transistor is connected to the first power supply voltage terminal, and a second electrode of the fourteenth transistor is connected to a second electrode of the seventeenth transistor and a control electrode of the eighteenth transistor;

the control electrode of the fifteenth transistor is connected to the second electrode of the thirteenth transistor and the second electrode of the sixteenth transistor, a first electrode of the fifteenth transistor is connected to the first power supply voltage terminal, and a second electrode of the fifteenth transistor is connected to the first signal input terminal;

a control electrode of the sixteenth transistor is connected to the second signal input terminal, a first electrode of the sixteenth transistor is connected to the second power supply voltage terminal, and the second electrode of the sixteenth transistor is connected to the second electrode of the thirteenth transistor and the control electrode of the fifteenth transistor;

a control electrode of the seventeenth transistor is connected to a second electrode of the eighteenth transistor and the second electrode of the fifteenth transistor, a first electrode of the seventeenth transistor is connected to the second power supply voltage terminal, and the second electrode of the seventeenth transistor is connected to the second electrode of the fourteenth transistor and the control electrode of the eighteenth transistor; and the control electrode of the eighteenth transistor is connected to the second electrode of the fourteenth transistor and the second electrode of the seventeenth transistor, a first electrode of the eighteenth transistor is connected to the second power supply voltage terminal, and the second electrode of the eighteenth transistor is connected to the first signal input terminal.

6. A method for driving a gate drive circuit, applied to drive the gate drive circuit as defined in claim 1 and comprising:

outputting, by the shift register, the first gate scanning signal stage by stage according to the preset scanning timing; and performing, by the buffer, the waveform inversion on the first gate scanning signal for a plurality of times to convert the first gate scanning signal into the second gate scanning signal, wherein rising edge time of the second gate scanning signal is less than rising edge time of the first gate scanning signal, and falling edge time of the second gate scanning signal is less than falling edge time of the first gate scanning signal.

7. The method according to claim 6, wherein prior to outputting the first gate scanning signal stage by stage according to the preset scanning timing, the method further comprises:

providing, by a level shifter, a first level signal and a second level signal to the shift register according to a preset timing, wherein the first level signal and the second level signal have opposite polarities.

8. A display device, comprising a gate drive circuit, wherein the gate drive circuit comprises a plurality of shift registers and buffers in cascade, wherein each of the shift registers is configured to output a first gate scanning signal stage by stage according to a preset scanning timing; and each of the buffers is configured to perform waveform inversion on the first gate scanning signal for a plurality of times to convert the first gate scanning signal into a second gate scanning signal, wherein falling edge time of the second gate scanning signal is less than falling edge time of the first gate scanning signal, and rising edge time of the second gate scanning signal is less than rising edge time of the first gate scanning signal;

wherein the shift register comprises a first transistor, a second transistor, a third transistor, a fourth transistor, a fifth transistor, a sixth transistor, a seventh transistor, an eighth transistor, a first storage capacitor, and a second storage capacitor; and wherein a control electrode of the first transistor is connected to a first clock signal terminal, a first electrode of the first transistor is connected to a first signal input terminal, and a second electrode of the first transistor is connected to a first node; the first node is a junction of the second electrode of the first transistor, a first electrode of the second transistor, a control electrode of the fourth transistor, and a first electrode of the eighth transistor;

a control electrode of the second transistor is connected to a second clock signal terminal, the first electrode of the second transistor is connected to the first node, and a second electrode of the second transistor is connected to a first electrode of the third transistor;

a control electrode of the third transistor is connected to a second node, the first electrode of the third transistor is connected to a first level signal terminal, and a second electrode of the third transistor is connected to the second electrode of the second transistor; the second node is a junction of the control electrode of the third transistor, a second electrode of the fourth transistor, a second electrode of the fifth transistor, a control electrode of the sixth transistor, and a first electrode plate of the first storage capacitor;

the control electrode of the fourth transistor is connected to the first node, a first electrode of the fourth transistor is connected to the first clock signal terminal, and the second electrode of the fourth transistor is connected to the second node;

a control electrode of the fifth transistor is connected to the first clock signal terminal, a first electrode of the fifth transistor is connected to a second level signal terminal, and the second electrode of the fifth transistor is connected to the second node;

the control electrode of the sixth transistor is connected to the second node, a first electrode of the sixth transistor is connected to the first level signal terminal and a second electrode plate of the first storage capacitor, and a second electrode of the sixth transistor is connected to a first gate scanning signal output terminal;

a control electrode of the seventh transistor is connected to a third node, a first electrode of the seventh transistor is connected to the second clock signal terminal, and a second electrode of the seventh transistor is connected to the first gate scanning signal output terminal and a second electrode plate of the second storage capacitor; the third node is a junction of the control electrode of the seventh transistor, a second electrode of the eighth transistor, and a first electrode plate of the second storage capacitor;

a control electrode of the eighth transistor is connected to the second level signal terminal, the first electrode of the eighth transistor is connected to the first node, and the second electrode of the eighth transistor is connected to the third node;

the first electrode plate of the first storage capacitor is connected to the second node, and the second electrode plate of the first storage capacitor is connected to the first level signal terminal and the first electrode of the sixth transistor; and the first electrode plate of the second storage capacitor is connected to the third node, and the second electrode plate of the second storage capacitor is connected to the first gate scanning signal output terminal and the second electrode of the seventh transistor.

9. The display device according to claim 8, wherein the buffer comprises an even quantity of inverters in cascade; and wherein each of the inverters is configured to perform waveform inversion on the first gate scanning signal once.

10. The display device according to claim 9, wherein the buffer comprises a first inverter and a second inverter, the first inverter comprises a ninth transistor and a tenth transistor, the second inverter comprises an eleventh transistor and a twelfth transistor, the ninth transistor and the tenth transistor have opposite polarities, and the eleventh transistor and the twelfth transistor have opposite polarities; and wherein a control electrode of the ninth transistor is connected to the first gate scanning signal output terminal of the shift register, a first electrode of the ninth transistor is connected to a first power supply voltage terminal, and a second electrode of the ninth transistor is connected to a control electrode of the eleventh transistor and a control electrode of the twelfth transistor;

a control electrode of the tenth transistor is connected to the first gate scanning signal output terminal of the shift register, a first electrode of the tenth transistor is connected to a second power supply voltage terminal, and a second electrode of the tenth transistor is connected to the control electrode of the eleventh transistor and the control electrode of the twelfth transistor;

the control electrode of the eleventh transistor is connected to the second electrode of the ninth transistor and the second electrode of the tenth transistor, a first electrode of the eleventh transistor is connected to the first power supply voltage terminal, and a second electrode of the eleventh transistor is connected to a second gate scanning signal output terminal; and the control electrode of the twelfth transistor is connected to the second electrode of the ninth transistor and the second electrode of the tenth transistor, a first electrode of the twelfth transistor is connected to the second power supply voltage terminal, and a second electrode of the twelfth transistor is connected to the second gate scanning signal output terminal.

11. The display device according to claim 10, wherein the gate drive circuit further comprises a level shifter; and wherein the level shifter is configured to provide a first level signal and a second level signal to the shift register according to a preset timing, wherein the first level signal and the second level signal have opposite polarities.

12. The display device according to claim 11, wherein the level shifter comprises a thirteenth transistor, a fourteenth transistor, a fifteenth transistor, a sixteenth transistor, a seventeenth transistor, and an eighteenth transistor; and wherein a control electrode of the thirteenth transistor is connected to a second signal input terminal, a first electrode of the thirteenth transistor is connected to the first power supply voltage terminal, and a second electrode of the thirteenth transistor is connected to a control electrode of the fifteenth transistor and a second electrode of the sixteenth transistor;

a control electrode of the fourteenth transistor is connected to the second signal input terminal, a first electrode of the fourteenth transistor is connected to the first power supply voltage terminal, and a second electrode of the fourteenth transistor is connected to a second electrode of the seventeenth transistor and a control electrode of the eighteenth transistor;

the control electrode of the fifteenth transistor is connected to the second electrode of the thirteenth transistor and the second electrode of the sixteenth transistor, a first electrode of the fifteenth transistor is connected to the first power supply voltage terminal, and a second electrode of the fifteenth transistor is connected to the first signal input terminal;

a control electrode of the sixteenth transistor is connected to the second signal input terminal, a first electrode of the sixteenth transistor is connected to the second power supply voltage terminal, and the second electrode of the sixteenth transistor is connected to the second electrode of the thirteenth transistor and the control electrode of the fifteenth transistor;

a control electrode of the seventeenth transistor is connected to a second electrode of the eighteenth transistor and the second electrode of the fifteenth transistor, a first electrode of the seventeenth transistor is connected to the second power supply voltage terminal, and the second electrode of the seventeenth transistor is connected to the second electrode of the fourteenth transistor and the control electrode of the eighteenth transistor; and the control electrode of the eighteenth transistor is connected to the second electrode of the fourteenth transistor and the second electrode of the seventeenth transistor, a first electrode of the eighteenth transistor is connected to the second power supply voltage terminal, and the second electrode of the eighteenth transistor is connected to the first signal input terminal.

* * * * *